United States Patent
Cheng et al.

(10) Patent No.: US 7,560,360 B2
(45) Date of Patent: Jul. 14, 2009

(54) METHODS FOR ENHANCING TRENCH CAPACITANCE AND TRENCH CAPACITOR

(75) Inventors: Kangguo Cheng, Beacon, NY (US); David M. Dobuzinsky, New Windsor, NY (US); Xi Li, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 11/468,472

(22) Filed: Aug. 30, 2006

(65) Prior Publication Data

US 2008/0122030 A1 May 29, 2008

(51) Int. Cl.
*H01L 21/20* (2006.01)
(52) U.S. Cl. .................. 438/432; 438/714; 438/723; 438/733; 438/738; 438/740; 257/E21.013; 257/E21.014; 257/E21.235; 257/E21.258; 257/E21.578
(58) Field of Classification Search .......... 257/301, 257/E29.347, E27.093, E21.396, E21.013, 257/14, 235, 252, 258, 312, 396, 572, 578, 257/651, 681; 438/243, 244, 426, 432, 714, 438/723, 733, 738, 740, 743
See application file for complete search history.

(56) References Cited

U.S. PATENT DOCUMENTS

| | | | | |
|---|---|---|---|---|
| 4,942,137 A | * | 7/1990 | Sivan et al. | 438/426 |
| 5,444,013 A | * | 8/1995 | Akram et al. | 438/398 |
| 5,895,740 A | | 4/1999 | Chien et al. | |
| 5,930,585 A | * | 7/1999 | Coronel et al. | 438/5 |
| 6,074,954 A | * | 6/2000 | Lill et al. | 438/710 |
| 6,448,131 B1 | | 9/2002 | Cabral, Jr. et al. | |
| 6,455,369 B1 | * | 9/2002 | Forster et al. | 438/249 |
| 6,495,411 B1 | * | 12/2002 | Mei | 438/239 |
| 6,555,430 B1 | | 4/2003 | Chudzik et al. | |
| 6,559,005 B2 | | 5/2003 | Gutsche et al. | |
| 6,620,675 B2 | | 9/2003 | Furukawa et al. | |
| 6,806,138 B1 | | 10/2004 | Cheng et al. | |
| 7,332,392 B2 | * | 2/2008 | Lin et al. | 438/243 |
| 2003/0068867 A1 | * | 4/2003 | Forster et al. | 438/386 |
| 2004/0079979 A1 | | 4/2004 | Lee et al. | |
| 2004/0095896 A1 | | 5/2004 | Chudzik et al. | |
| 2005/0048753 A1 | | 3/2005 | Schwan | |
| 2005/0282393 A1 | | 12/2005 | Cheng et al. | |
| 2005/0285175 A1 | | 12/2005 | Cheng et al. | |

OTHER PUBLICATIONS

Cheng et al., U.S. Appl. No. 12/120,535, filed May 14, 2008, Office Action Summary, Dec. 3, 2008, 13 pages.

* cited by examiner

*Primary Examiner*—Michael S Lebentritt
(74) *Attorney, Agent, or Firm*—Todd M. C. Li; Hoffman Warnick LLC

(57) ABSTRACT

Methods for enhancing trench capacitance and a trench capacitor so formed are disclosed. In one embodiment a method includes forming a first portion of a trench; depositing a dielectric layer in the first portion; performing a reactive ion etching including a first stage to etch the dielectric layer and form a micro-mask on a bottom surface of the first portion of the trench and a second stage to form a second portion of the trench having a rough sidewall; depositing a node dielectric; and filling the trench with a conductor. The rough sidewall enhances trench capacitance without increasing processing complexity or cost.

5 Claims, 5 Drawing Sheets

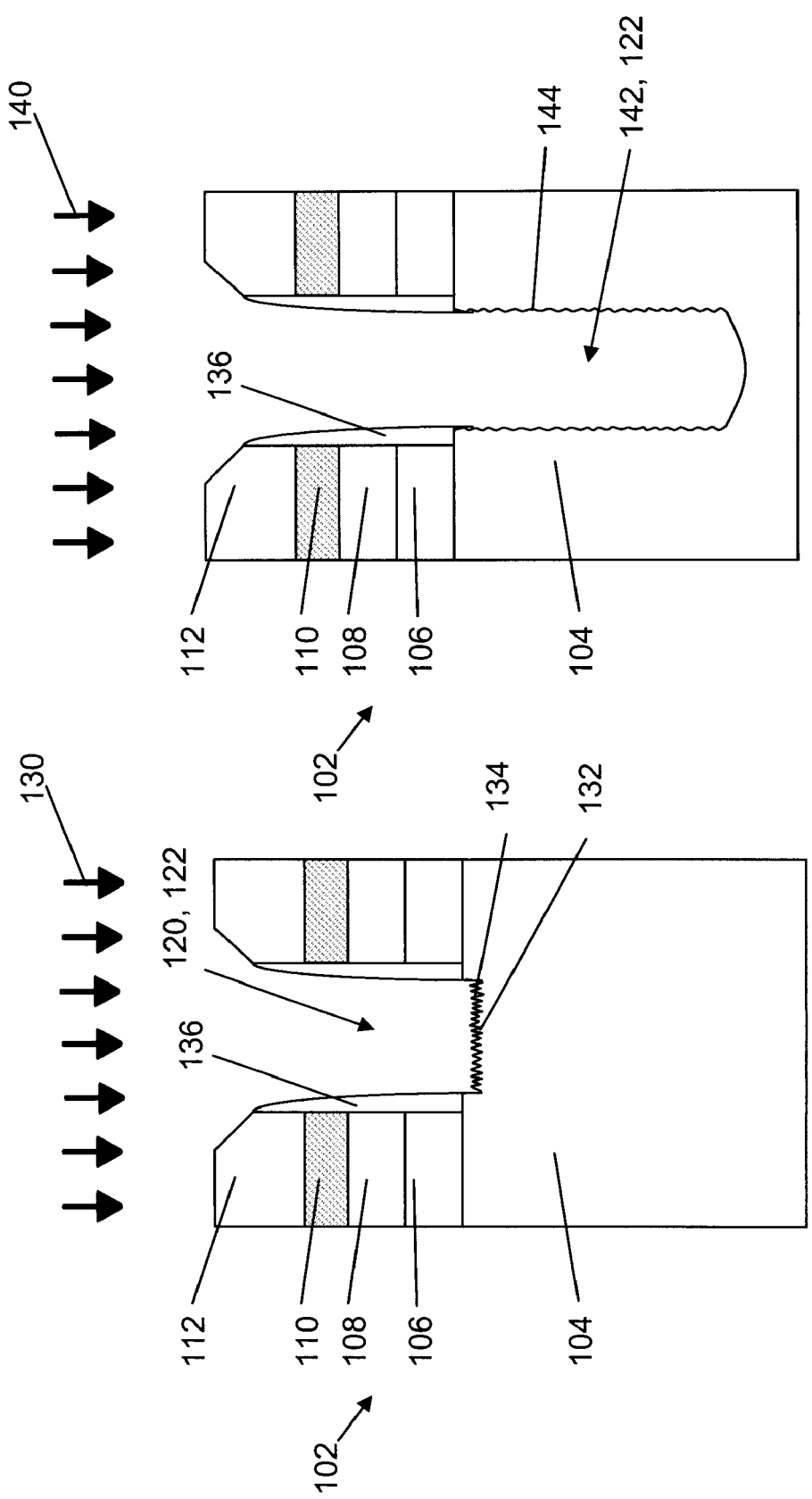

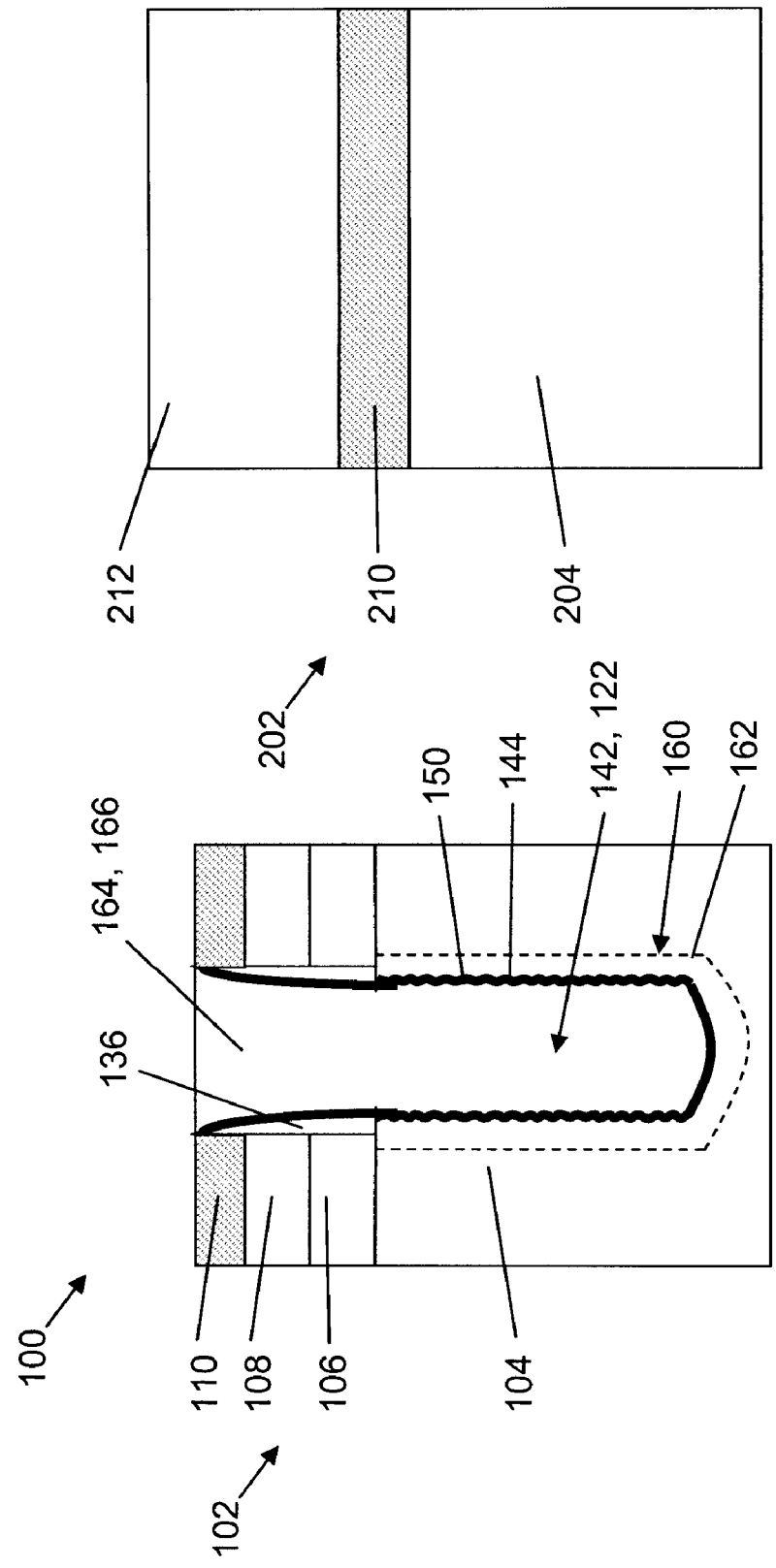

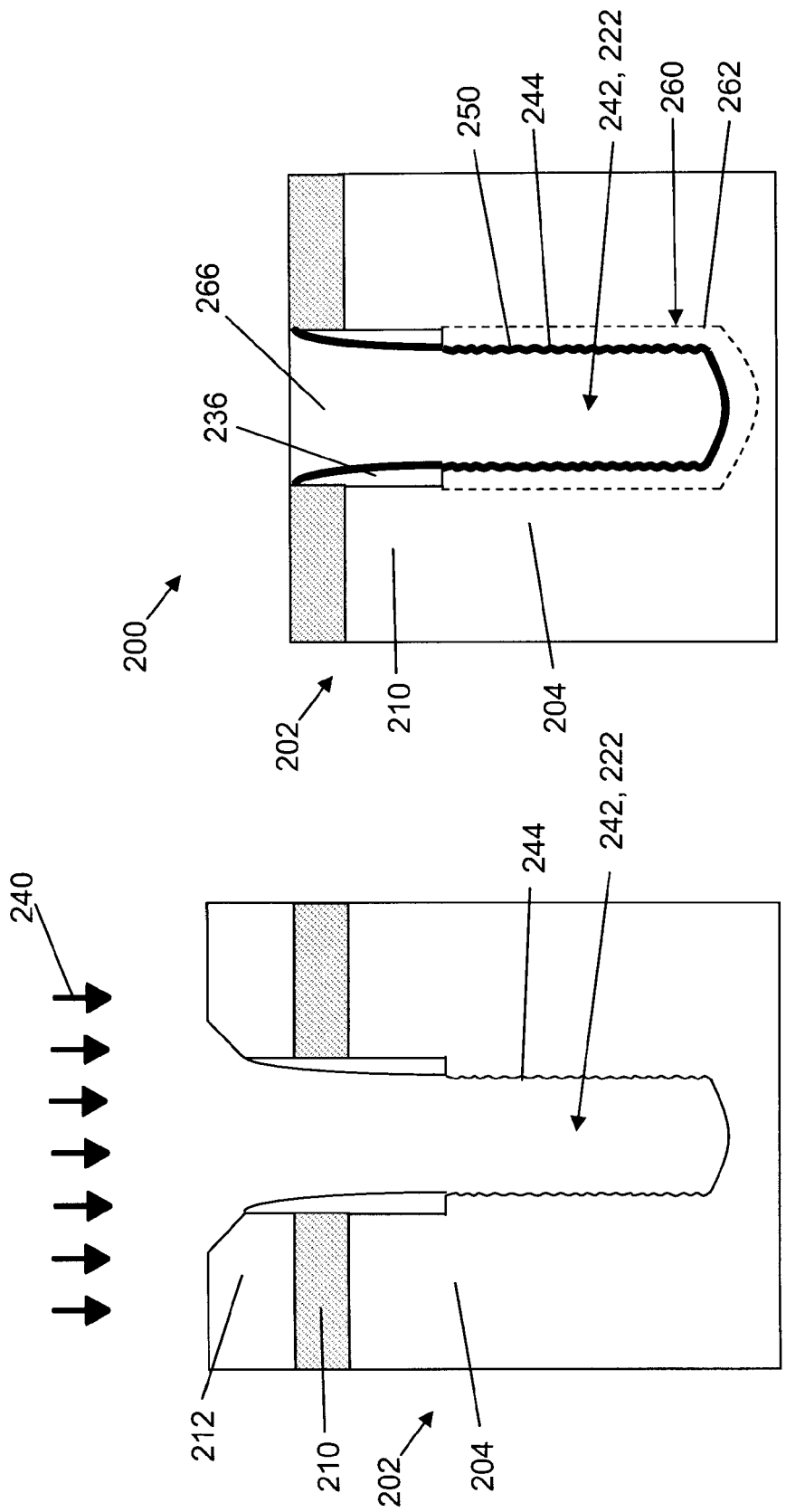

METHODS FOR ENHANCING TRENCH CAPACITANCE AND TRENCH CAPACITOR

BACKGROUND OF THE INVENTION

1. Technical Field

The invention relates generally to memory fabrication, and more particularly, to methods for enhancing trench capacitance and a trench capacitor so formed.

2. Background Art

Capacitance enhancement is essential for trench technology scaling. There are a variety of techniques to increase a surface area of trenches to increase capacitance. In one approach, the trench is formed in a bottle shape to increase the surface area. This approach, however, requires a sacrificial collar, and is susceptible to trench merging. The bottle shape approach also requires extra process steps. In another approach, hemispherical silicon grains (HSG) are formed on a sidewall of the trench to increase its surface area. This approach also requires a sacrificial collar and extra process steps, and further, narrows the trench. Use of new high dielectric constant materials (such as aluminum oxide or hafnium oxide) has also been proposed, but this approach requires new materials and presents numerous integration issues. It is therefore desired to have a capacitance enhancement without adding process complexity and cost.

SUMMARY OF THE INVENTION

Methods for enhancing trench capacitance and a trench capacitor so formed are disclosed. In one embodiment a method includes forming a first portion of a trench; depositing a dielectric layer in the first portion; performing a reactive ion etching including a first stage to etch the dielectric layer and form a micro-mask on a bottom surface of the first portion of the trench and a second stage to form a second portion of the trench having a rough sidewall; depositing a node dielectric; and filling the trench with a conductor. The rough sidewall enhances trench capacitance without increasing processing complexity or cost.

A first aspect of the invention provides a method of forming a trench capacitor, the method comprising: forming a first portion of a trench; depositing a dielectric layer in the first portion; performing a reactive ion etching including a first stage to etch the dielectric layer and form a micro-mask on a bottom surface of the first portion of the trench and a second stage to form a second portion of the trench having a rough sidewall; depositing a node dielectric; and filling the trench with a conductor.

A second aspect of the invention provides a trench capacitor comprising: a deep trench in a substrate; a first electrode in the substrate; a second electrode in the deep trench; and a dielectric between the first and the second electrodes, wherein the deep trench has sidewalls with roughness having an average amplitude of less than approximately 5 nanometers.

A third aspect of the invention provides a method comprising: forming a trench having a dielectric layer therein; and first reactive ion etching (RIE) the dielectric layer in the trench to form a micro-mask on a bottom surface of the trench.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 1-5 show one embodiment of a method according to the invention.

FIGS. 6-10 show another embodiment of a method according to the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Turning to drawings, FIGS. 1-5 show one embodiment of a method of forming a trench capacitor 100 (FIG. 5) in a semiconductor-on-insulator (SOI) substrate 102, and FIGS. 6-10 show another embodiment of a method of forming a trench capacitor 200 (FIG. 10) in bulk substrate 202.

Figure 1:
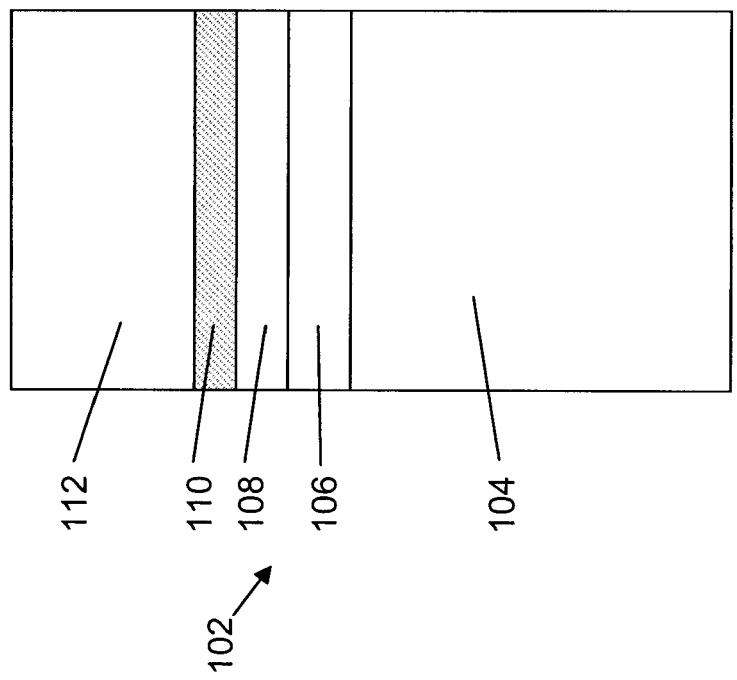

As shown in FIG. 1, in one embodiment, processing begins with SOI substrate 102 including a substrate 104, a buried insulator layer 106 (e.g., silicon oxide ($SiO_2$)) and a semiconductor layer 108 (e.g., silicon (Si), germanium (Ge), silicon germanium (SiGe), etc.). SOI substrate 102 has a pad layer 110 and a hardmask 112. Pad layer 110 may include any now known or later developed pad layer materials such as a silicon nitride ($Si_3N_4$) layer and a silicon oxide ($SiO_2$) layer (not individually shown). Hardmask 112 may include any now known or later developed hardmask material such as tetraethyl orthosilicate, $Si(OC_2H_5)_4$ (TEOS) based silicon oxide ($SiO_2$). Substrate 104 may include, for example, silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include, for example, II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 102 may be strained. For example, semiconductor layer 108 may be strained.

Figure 2:
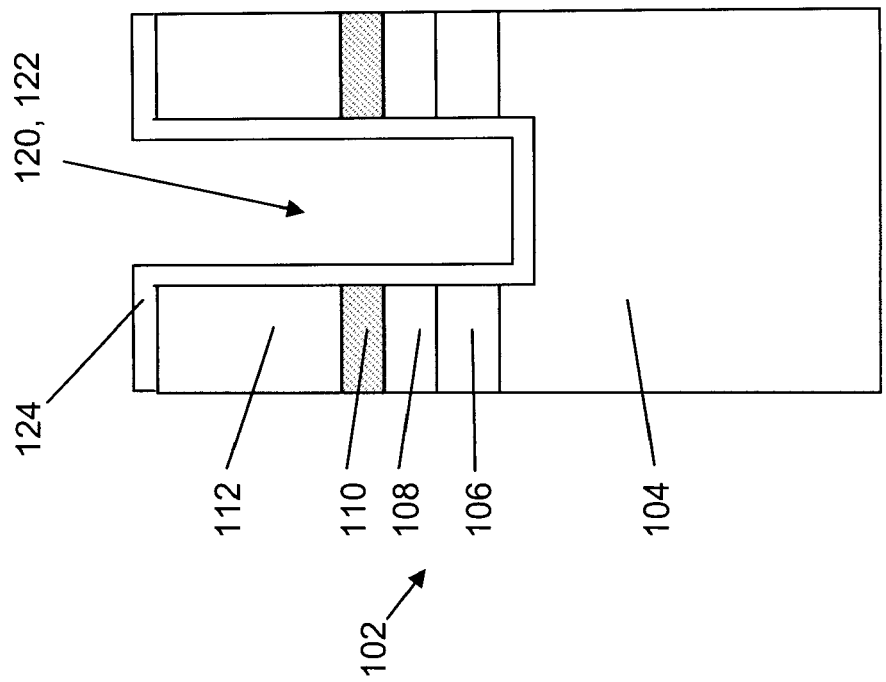

FIG. 2 shows forming a first (upper) portion 120 of a trench 122. First portion 120 may be formed, for example, by patterning hard mask 112 and etching, e.g., using a reaction ion etch (RIE), through hard mask 112, pad layer 110, semiconductor layer 108, buried insulator layer 106 and perhaps slightly into substrate 104. FIG. 2 also shows depositing a dielectric layer 124 in first portion 120. "Depositing" may include any now known or later developed techniques appropriate for the material to be deposited, e.g., chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating and evaporation. In one embodiment, dielectric layer 124 may include silicon nitride ($Si_3N_4$); however, other materials may also be employed. Dielectric layer 124 is conformally deposited to cover the top, bottom and sidewalls of first portion 120 of trench 122.

FIGS. 3-4 show performing a RIE including a first stage 130 (FIG. 3) and a second stage 140 (FIG. 4). In FIG. 3, first stage RIE 130 etches dielectric layer 124 (FIG. 2) and forms a micro-mask 132 on a bottom surface 134 of first portion 120 of trench 122. In one embodiment, first stage RIE 130 includes a non-uniform RIE; however, this may not always be necessary. First stage RIE 130 also forms a spacer 136 within first portion 120, which protects semiconductor layer 108 and buried insulator layer 106 from undesired attack and doping. In other words, first stage RIE 130 removes dielectric layer 124 on bottom surface 134 of trench 122, forming spacer 136. The process conditions of first stage RIE 130 are designed such that a micro mask 132 is created in substrate 104 after spacer 136 is formed.

FIG. 4 shows performing second stage RIE 140 to form a second portion 142 of trench 122, i.e., into substrate 104, having a rough sidewall 144. Rough sidewall 144 is formed based on micro-mask 132. Rough sidewall 144 has dimensions of a nanometer scale. For example, rough sidewall 144 may have an average amplitude of less than approximately 5 nanometers. Second stage RIE 140 etches substrate 104 to complete deep trench formation. Micro-mask 132 produced in first stage RIE 130 produces a rough sidewall 144, as shown in FIG. 4. First and second RIE stages 130, 140 are performed in a single process chamber. This is in contrast to conventional trench spacer forming processes which perform a dedicated dielectric RIE process in a first chamber to form a spacer before etching a deep trench in a second chamber. One exemplary RIE process condition for creating rough sidewall 144 is shown in Table 1. Other RIE processes are also possible and within the scope of the invention.

In a first stage 130, the process conditions include approximately 50 milliTorr (mT) pressure, approximately 300 standard cubic centimeters (sccm) hydrogen bromide (HBr), approximately 75 sccm ammonia ($NF_3$), approximately 5 sccm oxygen ($O_2$) and a power configuration that removes dielectric layer 124 (FIG. 2) in the form of silicon nitride at trench bottom surface 134 and at the same time creates micro mask 132. A second stage 140 may include several steps to etch deep trench 122. The process conditions for the first three parts of the second stage may have the same pressure (approximately 150 mT), same HBr flow rate (approximately 300 sccm), same $NF_3$ flow rate (approximately 36 sccm), same high frequency power (500 W), and different $O_2$ flow rates (from approximately 33 to approximately 23 sccm), and different low frequency power (from approximately 1200 W to approximately 1500 W). In the last two parts of the second stage, the same pressure (approximately 200 mT), same HBr flow rate (approximately 300 sccm), same $NF_3$ flow rate (approximately 32 sccm), same high frequency power (approximately 500 W), same low frequency power (approximately 1800 W), and different $O_2$ flow rates (approximately 17 sccm and approximately 18 sccm) may be used. There may be stabilization processes between two neighboring etchings.

FIG. 5 shows finalizing steps for forming trench capacitor 100. For example, any remaining hardmask 112 (FIG. 4) may be stripped at this or later stage. Furthermore, an outer electrode 160 can be formed from substrate 104 as-is or a buried plate 162 (phantom line) can optionally be formed in substrate 104. In this case, buried plate 162 may include a portion of substrate 104 which is heavily doped. Buried plate 162 may be formed by any conventional process, such as gas phase doping, liquid phase doping, plasma doping, plasma immersion ion implantation, outdiffusion doping from a solid film such as arsenic doped silicate glass (ASG), or any combination thereof, which are all well known in the art. Spacer 136 protects SOI layer 108 and BOX layer 106 from undesired doping during the formation of buried plate 162. Buried plate 162 is self-aligned to spacer 136. FIG. 5 also shows depositing a node dielectric 150 that follows the contours of rough sidewall 144. Node dielectric 150 may include any now known or later developed insulator appropriate for forming a trench capacitor 100, e.g., silicon oxide, silicon nitride, silicon oxynitride, high-k material having a relative permittivity above about 10, or any combination of these materials. Examples of high-k material include but are not limited to metal oxides such as $Ta_2O_5$, $BaTiO_3$, $HfO_2$, $ZrO_2$, $Al_2O_3$, or metal silicates such as $HfS_ixO_y$ or $HfS_ixO_yN_z$, where x, y, and z represent relative proportions, each greater than or equal to zero and x+y+z=1 (1 being the total relative mole quantity).

TABLE 1

|  | Stab | Time | Stab | Time | Time | Time | Stab | Time | Time |
|---|---|---|---|---|---|---|---|---|---|
| Time | 60 | 10 | 60 | 20 | 20 | 30 | 60 | 120 | 300 |
| Press | 50 | 50 | 150 | 150 | 150 | 150 | 200 | 200 | 200 |
| High RF | 0 | 400 | 0 | 500 | 500 | 500 | 0 | 500 | 500 |
| Low RF | 0 | 600 | 0 | 1200 | 1350 | 1500 | 0 | 1800 | 1800 |
| HBr | 300 | 300 | 300 | 300 | 300 | 300 | 300 | 300 | 300 |
| NF3 | 75 | 75 | 36 | 36 | 36 | 36 | 32 | 32 | 32 |
| O2 | 5 | 5 | 32.5 | 32.5 | 27.5 | 23 | 17 | 17 | 18 |
| BP Ctr | 10 | 10 | 10 | 10 | 10 | 10 | 10 | 10 | 10 |
| BP Edge | 40 | 40 | 40 | 40 | 40 | 40 | 40 | 40 | 40 |
|  | | Nitride breakthrough step | | | | | | | |

FIG. 5 also shows filling trench 122 with a conductor 164 to form an inner electrode 166. Inner electrode 166 may include, for example, amorphous silicon, polycrystalline silicon (hereinafter "polysilicon"), germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), or any suitable combination of these materials. Inner electrode 166 material may further include dopants. In one embodiment, inner electrode 166 material includes doped polysilicon. In one embodiment, a planarization process such as chemically mechanical polishing (CMP) is performed, rendering inner electrode 166 co-planar with pad layer 110.

Methods for forming node dielectric 150 and inner electrode 164 material include but are not limited to thermal oxidation, chemical oxidation, thermal nitridation, atomic layer deposition (ALD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, ion beam deposition, electron beam deposition and/or laser assisted deposition.

FIGS. 6-10 show another embodiment of a method of forming a trench capacitor 200 (FIG. 10) in bulk substrate 202. The process is substantially similar to that described above. As shown in FIG. 6, processing begins with a bulk substrate 202. Substrate 204 may include any of the materials listed above relative to substrate 104 (FIGS. 1-5). Substrate 202 has a pad layer 210 and a hardmask 212 thereover. Pad layer 210 and hardmask 212 may include any of the materials listed above relative to pad layer 110 and hard mask 112 (FIGS. 1-5). A portion or entire semiconductor substrate 204 may be strained.

Figure 7:
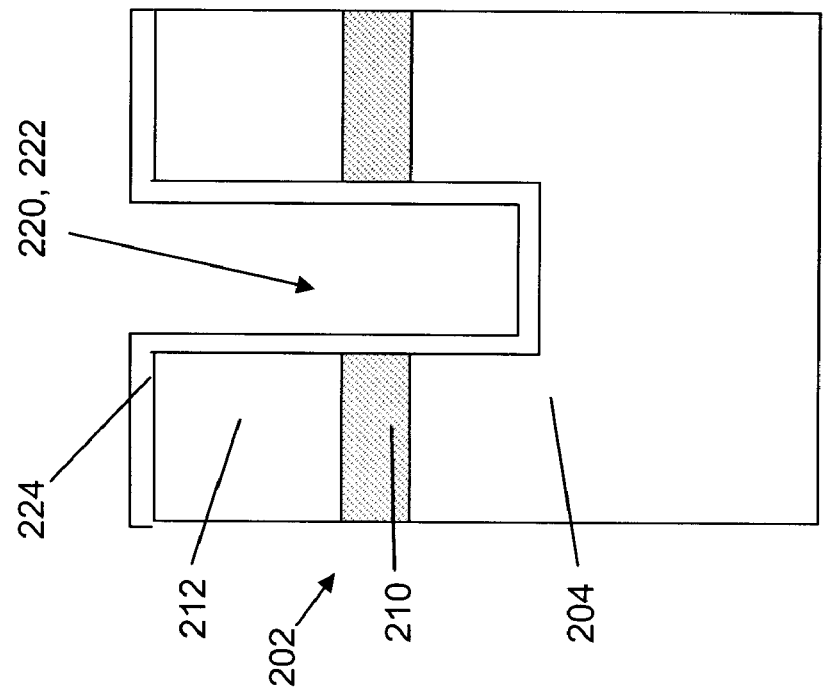

FIG. 7 shows forming a first (upper) portion 220 of a trench 222. First portion 220 may be formed, for example, by patterning hard mask 212 and etching, e.g., using a RIE, through hard mask 212 and pad layer 210 into substrate 204. First portion 220 may extend into substrate 204 to a depth of, for example, approximately 1 μm. FIG. 7 also shows depositing (as described above) a dielectric layer 224 in first portion 222. In one embodiment, dielectric layer 224 may include silicon nitride ($Si_3N_4$); however, other materials may also be employed. Dielectric layer 224 is conformally deposited to cover the top, bottom and sidewall of first portion 220 of trench 222.

Figure 8:
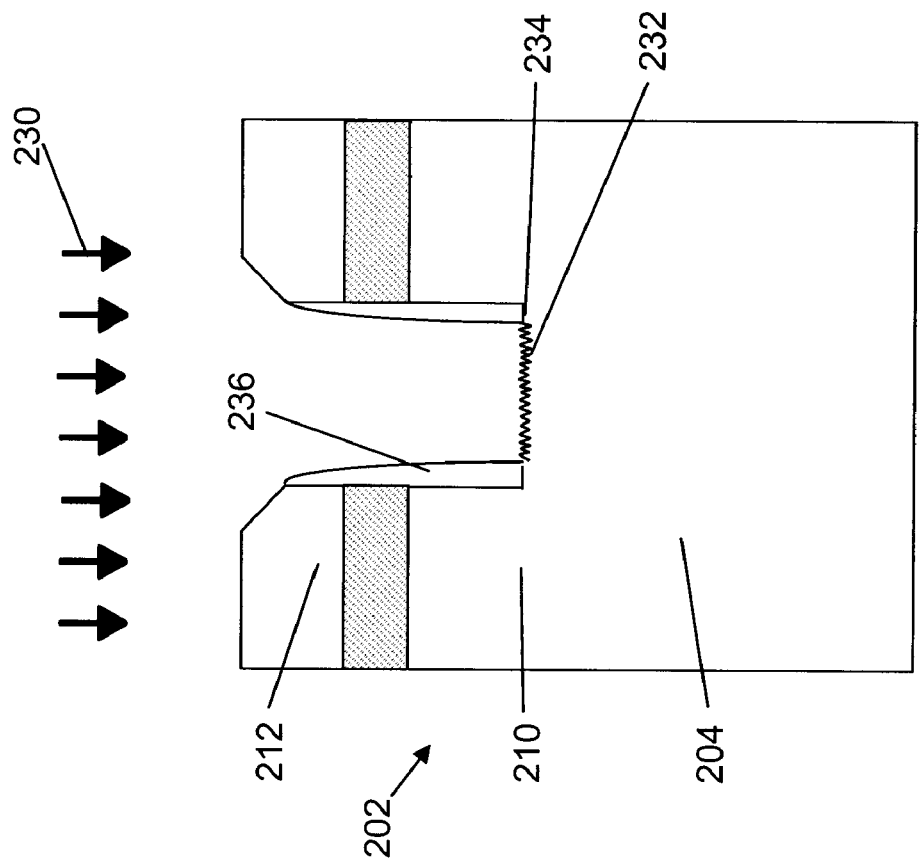

FIGS. 8-9 show performing a RIE including a first stage 230 (FIG. 8) and a second stage 240 (FIG. 9). In FIG. 8, first stage RIE 230 etches dielectric layer 224 (FIG. 7) and forms a micro-mask 232 on a bottom surface 234 of first portion 220 (FIG. 7) of trench 222 (FIG. 7). In one embodiment, first stage RIE 230 includes a non-uniform RIE; however, this may not always be necessary. First stage RIE 230 also forms a spacer 236 within first portion 220. Spacer 236 protects a sidewall of first portion 220 from undesired attack and doping. In other words, first stage RIE 230 removes dielectric layer 224 on bottom surface 234 of trench 222, forming spacer 236. The process conditions of first stage RIE 230 are designed such that a micro-mask 232 is created in substrate 204 after spacer 236 is formed.

FIG. 9 shows performing second stage RIE 240 to form a second portion 242 of trench 222 having a rough sidewall 244. Rough sidewall 244 is formed based on micro-mask 232 (FIG. 8). As described above, rough sidewall 244 has dimensions of a nanometer scale. For example, rough sidewall 244 may have an average amplitude of less than approximately 5 nanometers. Second stage RIE 240 further etches substrate 204 to complete deep trench formation. Micro-mask 232 produced in first stage RIE 230 helps produce a rough sidewall 244, as shown in FIG. 9. First and second RIE stages 230, 240 are performed in a single process chamber. The same RIE process conditions as described above may be employed.

FIG. 10 shows finalizing steps for forming trench capacitor 200. Each of these processes may be as described above relative to FIG. 5. Trench capacitor 200 may include, among other things, rough sidewall 244, a node dielectric 250, an inner electrode 266, an outer electrode 260 (e.g., including a buried plate 262 (phantom line)).

In another embodiment, shown in FIGS. 1-3 and 5-8, the above-described RIE process may be employed to form micro-mask 132, 232 alone. In this case, a trench 122, 222 having a dielectric layer 124, 224, e.g., silicon nitride, therein is formed, and a first RIE 130, 230 is performed on dielectric layer 124, 224 in trench 122, 222 to form micro-mask 132, 232 on bottom surface 134, 234 of trench 122, 222. First RIE 130, 230 forms a spacer 136, 236 on a sidewall of trench 122, 222, and may be a non-uniform etch. A second RIE 140, 240, shown in FIGS. 4 and 9, may also be provided to extend trench 122, 222 into substrate 104, 204 to form a deep trench below spacer 136, 236. As described above, the rough trench sidewall 144, 244 has nanometer scale roughness, e.g., having an average amplitude of less than approximately 5 nanometers. First RIE 130, 230 and second RIE 140, 240 may occur in a single process chamber.

The above-described methods integrate the dielectric spacer 136, 236 RIE process with deep trench 142, 242 etch process, which eliminates conventional dedicated spacer RIE and post-clean processes, and therefore significantly saves process time. Furthermore, the above-described embodiments remove the need to dedicate equipment to dielectric spacer RIE and thus reduce the cost associated with equipment investment and maintenance. In addition, an approximately 12-15% trench capacitance enhancement is achieved through rough sidewall 144, 244 by increasing the trench surface area. Furthermore, the above-described methods have advanced scalability because the roughness on trench sidewall is in the nano-scale. The merging trench issue in conventional trench widening approaches is eliminated. Finally, the above-described methods are fully compatible with existing trench processes. No exotic materials and processes are needed to enhance trench capacitance.

In one embodiment, trench capacitor 100, 200 includes deep trench 122, 222 in substrate 104, 204; first electrode 160, 260 in substrate 104, 204, second electrode 166, 266 in deep trench 122, 222, and dielectric 150, 250 between the first and the second electrodes. As noted above, deep trench 122, 222 has rough sidewall 144, 244 with roughness having an average amplitude of approximately 5 nanometers, which is significantly smaller than conventional devices. A spacer 136, 236 may be disposed in an upper portion 120, 220 of deep trench 122, 222. First electrode 160, 260 may include buried plate 162, 262 in substrate 104, 204, which is self-aligned to spacer 136, 236.

It is understood that optionally, other trench capacitance enhancements can be performed before or after the above-described methods. Capacitance can be enhanced by forming a bottle-shape in the lower trench section, roughening the sidewalls of the lower trench section by forming hemispherical silicon grains (HSG) thereon, or by any other suitable conventional trench capacitance enhancement method. The combination of two or more of these conventional approaches, such as the combination of bottling and HSG with the teachings of the invention, can be performed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as portion of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A trench capacitor, comprising:

a substrate;

a buried insulator layer deposited over the substrate;

a semiconductor layer deposited over the buried insulator layer;

a pad layer deposited over the semiconductor layer;

a deep trench extending through the pad layer, semiconductor layer, buried insulator layer to the substrate, the deep trench separated from sidewalls of the of the pad layer, semiconductor layer, buried insulator layer by a pair of opposing spacers, the deep trench having opposing sidewalls extending through the pad layer, semiconductor layer, buried insulator layer to a bottom region in the substrate, wherein the sidewalls have a smooth contour from the pad layer through the semiconductor layer and the buried insulator layer, a rough contour starting at a top region of the substrate below the buried insulator layer and a smooth contour at the bottom region of the substrate;

a first electrode in the substrate;

a second electrode in the deep trench; and a dielectric between the first and the second electrodes, wherein the dielectric follows the smooth contour of the sidewalls of the deep trench through the pad layer, semiconductor layer, and buried insulator layer, the rough contour of the sidewalls of the deep trench in the substrate and the smooth contour of the bottom region of the deep trench in the substrate, wherein the sidewalls of the deep trench have an average amplitude of less than approximately 5 nanometers.

2. The trench capacitor of claim 1, wherein the pair of opposing spacers include silicon nitride.

3. The trench capacitor of claim 1, wherein the first electrode includes a buried plate in the substrate.

4. The trench capacitor of claim 3, wherein the buried plate is self-aligned to the pair of opposing spacers.

5. The trench capacitor of claim 3, wherein a top portion of the buried plate is self-aligned to a bottom portion of the buried insulator layer.

* * * * *